United States Patent
Ozeki

(10) Patent No.: US 8,793,297 B2
(45) Date of Patent: Jul. 29, 2014

(54) PHASE INTERPOLATOR, SEMICONDUCTOR DEVICE AND TESTING METHOD THEREOF

(75) Inventor: Yoshitomo Ozeki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 414 days.

(21) Appl. No.: 13/356,788

(22) Filed: Jan. 24, 2012

(65) Prior Publication Data

US 2012/0119807 A1     May 17, 2012

Related U.S. Application Data

(63) Continuation of application No. PCT/JP2009/003783, filed on Aug. 6, 2009.

(51) Int. Cl.
   *G06F 17/17*     (2006.01)
   *G01R 31/317*   (2006.01)

(52) U.S. Cl.
   CPC .................................. *G01R 31/31726* (2013.01)
   USPC .......................................................... 708/313

(58) Field of Classification Search
   CPC .......... H03H 17/0664; H03H 17/0657; H03H 17/0671; H03H 17/0685; G06F 17/17
   USPC .......................................................... 708/313
   See application file for complete search history.

(56) References Cited

U.S. PATENT DOCUMENTS

| | | | |
|---|---|---|---|
| 3,445,593 A * | 5/1969 | Perkett et al. | 375/330 |
| 5,912,925 A * | 6/1999 | Palermo et al. | 375/258 |
| 7,555,091 B1 | 6/2009 | Lewicki et al. | |
| 2005/0221776 A1 | 10/2005 | Okanobu | |
| 2006/0294442 A1 | 12/2006 | Kanter et al. | |
| 2007/0091701 A1 | 4/2007 | Sakai | |
| 2007/0146014 A1 | 6/2007 | Cheung | |
| 2007/0252735 A1 | 11/2007 | Shi et al. | |
| 2007/0280032 A1 | 12/2007 | Kwak | |

FOREIGN PATENT DOCUMENTS

| | | |
|---|---|---|
| JP | 8-271589 | 10/1996 |
| JP | 2000-227460 | 8/2000 |
| JP | 2007-108055 | 4/2007 |

OTHER PUBLICATIONS

Extended European Search Report issued Jul. 19, 2013 in corresponding European Application No. 09848023.9.
International Search Report for PCT/JP2009/003783 mailed Nov. 10, 2009.

* cited by examiner

*Primary Examiner* — Tan V. Mai
(74) *Attorney, Agent, or Firm* — Staas & Halsey LLP

(57) ABSTRACT

Two selected testing selectors output testing input signals of reverse phases from each other according to the first control signal. Two selectors corresponding to the two testing selectors output the testing input signals output from the two testing selectors according to the second control signal. Two mixers corresponding to the two selectors output an output signal in which weighting is added to the testing input signals output from the two selectors are compounded. A detection circuit outputs an error signal when the output signal output from the two mixers is larger than a threshold value.

8 Claims, 6 Drawing Sheets

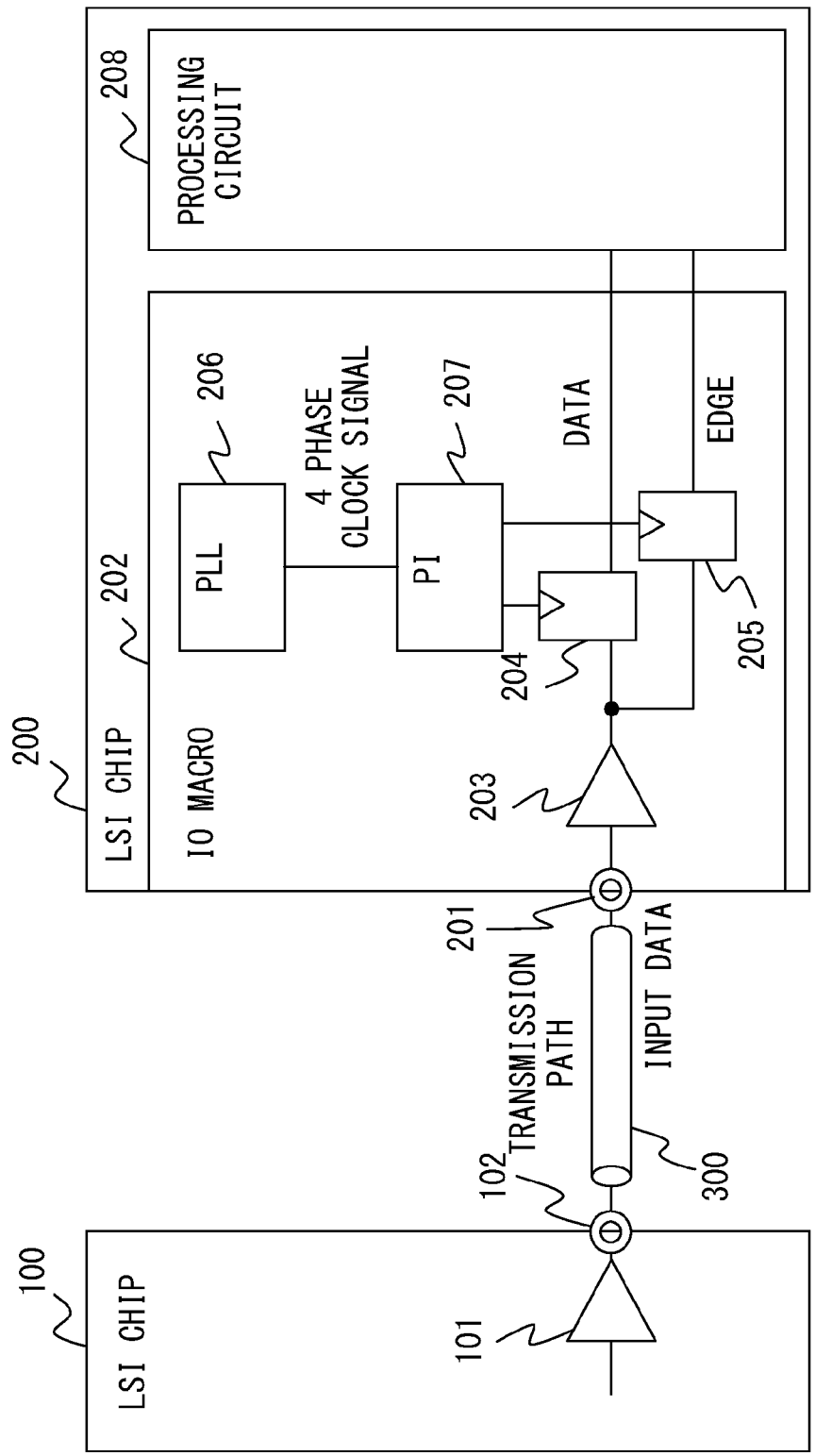
F I G. 1

PHASE INTERPOLATOR, SEMICONDUCTOR DEVICE AND TESTING METHOD THEREOF

CROSS-REFERENCE TO RELATED APPLICATION

This application is a continuation application of International PCT Application No. PCT/JP2009/003783 which was filed on Aug. 6, 2009.

FIELD

The present invention relates to a phase interpolator, a semiconductor device and a testing method thereof.

BACKGROUND

API (Phase Interpolator) is a circuit that generates, during an actual operation of a semiconductor device such as an LSI (Large Scale Integrated Circuit) and the like (during system operation in a case in which the semiconductor device is integrated in to a computer device), a signal of a desired phase in an IO macro (Input Output Macro Cell) being an input/output circuit cell of an external interface of the semiconductor device. The operation of the phase interpolator is checked by performing a function test included in an LSI test in the LSI manufacturing process.

For example, to a mixer constituting the phase interpolator, static signals, specifically, two potentials that are different from each other for example, a low level signal and a high level signal are applied. In this state, by a control signal (digital signal), a control switch of the current source is switched in a DAC (Digital Analog Converter) that constitutes apart of the mixer. Accordingly, in the output of the phase interpolator, the weighting of the two input potentials is changed, to check the change in the output level. By judging the output level of, the static operation of the phase interpolator in the function test is checked.

Meanwhile, in a semiconductor integrated circuit and a testing evaluation method thereof, measurement of the voltage value of a direct current voltage by smoothing a voltage waveform output from a chain circuit composed of logic gates into the direct current voltage by a phase difference/voltage conversion circuit has been known.

In addition, in an input check circuit, an input check method and in a burn-in substrate, identification of any input trouble by connecting a plurality of input terminals respectively to the gate terminal of a P channel transistor upon the check, a plurality of input signals whose phases are shifted from each other are respectively input to the input terminal, to identify whether there is any input trouble has been known.

PRIOR ART DOCUMENTS

Patent Documents

Patent Document 1: Japanese Laid-open Patent Publication No. H08-271589
Patent Document 2: Japanese Laid-open Patent Publication NO. 2000-227460

SUMMARY

A disclosed phase interpolator has a plurality of testing selectors, a plurality of selectors, a plurality of mixers, an output circuit, and a detection circuit. The plurality of testing selectors are provided corresponding to the plurality of selectors, each receive input of a plurality of testing input signals of different phases, and each output one of the plurality of testing input signals according to the first control signal. The plurality of selectors each receive input of predetermined input signals of different phases and a testing input signal output from a corresponding testing selector, and each output one of the input signal and the testing input signal output from the corresponding testing selector according to the second control signal. The plurality of mixers are provided corresponding to the plurality of selectors, each receive input of output of a corresponding selector and output an output signal in which signals in which weighting is added to output of the corresponding selector are compounded according to the third control signal. The output circuit output the output signal output from the plurality of mixers. The detection circuit detects fluctuation in the amplitude of the output signal output from the plurality of mixers.

BRIEF DESCRIPTION OF DRAWINGS

FIG. 1 is a diagram illustrating an example of a semiconductor device including a phase interpolator.

DESCRIPTION OF EMBODIMENTS

Figure 2:
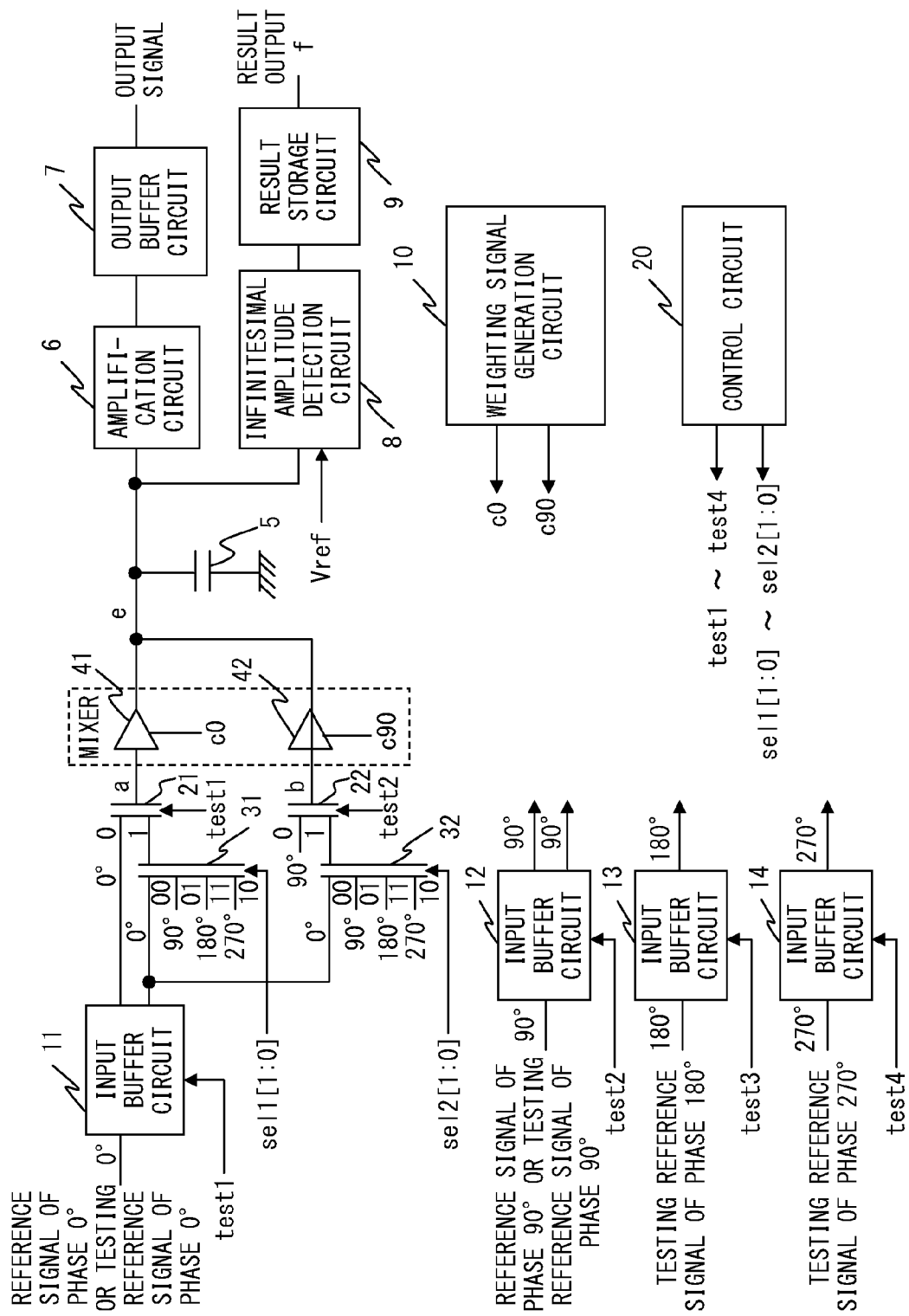
FIG. 2 is a diagram illustrating an example of a phase interpolator.

As described above, since a phase interpolator is a circuit that generates a signal or a desired phase in an IO macro (Input Output Macro Cell) being an input/output circuit cell of an external interface of a semiconductor device, a test that match the actual system operation as much as possible is important. However, according to the function test described above for the phase interpolator, since only a static low level and high level signals are applied to a differential circuit, only the static operation can be checked. In other words, the function test alone cannot examine the dynamic operation including the delay of the operation signal and the tilt of the waveform and the like.

A purpose of the embodiment is to provide a phase interpolator that is suitable for testing the dynamic operation.

FIG. 1 is a diagram illustrating an example of a semiconductor apparatus including a phase interpolator.

The semiconductor device in FIG. 1 includes semiconductor integrated circuit devices (hereinafter, an LSI chip) 100 and 200, and a transmission path 300 that connects them. The LSI chip 100 that transmits an input signal includes an output terminal 102 connected to an output buffer circuit 101. The LSI chip 200 that receives an input signal includes an input terminal 201. The transmission path 300 connects the output terminal 102 and the input terminal 201. The LSI chip 100 transmits input data to the LSI chip 200 from the output buffer 101 via the transmission path 300. Input data is, for example, a serial signal that is transmitted by a so-called embedded system in which a clock is embedded in the data.

The LSI chip 200 includes an IO macro 202 and a processing circuit 208. The IO macro 202 is an input circuit cell, and extracts the data and the edge, in other words the clock, from the input signal received from the LSI chip 100, and input these to the processing circuit 208. The processing circuit 208 is a circuit that performs a process determined in advance for the input signal. The IO macro 202 includes an input buffer circuit 203, a data output circuit 204, an edge output circuit 205, a PLL (Phase Locked Loop) 206, and a PI 207.

The input data transmitted through the transmission path 300 is input to the input buffer circuit 203 via the input terminal 201. The input buffer circuit 203 inputs the received input data to the data output circuit 204 and the edge output circuit 205.

Meanwhile, the PLL 206 generates clock signals of four phases, and provides these to the phase interpolator 207. The clock signals of four signals are clocks whose phases are 0°, 90°, 180°, 270°, respectively. The clock of the 0° phase is a signal whose phase is 0°. For example, the clock of the 90° phase is a signal whose phase is shifted by 90° from the phase 0° clock. The same applies to the other signals.

The phase interpolator 207 generates signals of four phases a signal $\alpha$, a signal ($\alpha$+90°), a signal ($\alpha$+180°), and a signal ($\alpha$+270°). For example, the signal $\alpha$ is a signal whose phase is $\alpha$°. The phase $\alpha$ is a desired phase determined according to the phase of the input data. The same applies to the other signals.

The phase interpolator 207 provides the signal ($\alpha$+90°) and the signal ($\alpha$+270°) to the data output circuit 204. The phase interpolator 207 provides the signal $\alpha$ and the signal ($\alpha$+180°) to the edge output circuit 205.

The data output circuit 204 extracts data from input data according to the signal ($\alpha$+90°) and the signal ($\alpha$+270°) provided from the phase interpolator 207, and outputs it to the processing circuit 208. The edge output circuit 205 extracts data from input data according to the signal $\alpha$ and the signal ($\alpha$+180°) provided from the phase interpolator 207, and outputs it to the processing circuit 208. The processing circuit 208 performs processing of the input data in synchronization with the input edge and clock.

FIG. 2 is a diagram illustrating an example of the phase interpolator.

The interpolator in FIG. 2 has a plurality of buffer circuits 11 and 12, a plurality of selectors 21 and 22, a plurality of testing selectors 31 and 32, a plurality of mixers 41 and 42, a capacitor 5, an amplification circuit 6, an output buffer circuit 7, an infinitesimal amplitude detection circuit 8, a result storage circuit 9, an weighting signal generation circuit 10, and a control circuit 20.

The phase interpolator in FIG. 2 uses two reference signals whose phases are different as predetermined input signals with different phases, and generates a signal of a desired phase by mixing these two reference signals. For example, a 45° signal is generated by mixing a reference signal of 0° phase and a reference signal of 90° phase with equal weighting for each other. The mixing is described in detail later.

In the phase interpolator in FIG. 2, reference signals of phase 0° and 90° as two reference signals whose phases are different. The reference signal of phase 0° is a signal having an advance amount of 0°. The reference signal of phase 90° is a signal having an advance amount of 90° shifted with respect to the reference signal of phase 0°. Accordingly, in the phase interpolator in FIG. 2, two selectors 21 and 22, two testing selectors 31 and 32, two mixers 41 and 42 are provided. The number of selectors and so on is not limited to be two.

In the interpolator in FIG. 2, as described below, the mixer 41 and the mixer 42 are realized by a differential circuit. For this reason, when a reference signal having an advance amount of 0° is input to the mixer 41, a signal of phase 180° that is the reverse phase of the phase of the reference signal of phase 0° is input at the same time. In the same manner, to the mixer 41, a reference signal of phase 90° is input, and at the same time, a signal of phase 270° that is the reverse phase of the phase of the reference signal of phase 90° is input. In the description below, for example, the reference signal of phase 0° and the reference signal of phase 180° that is the reverse phase of the phase of the reference signal of phase 0° being input to the mixer is simply referred to as "the reference signal of phase 0° is input" to the mixer 41.

Meanwhile, the phase interpolator in FIG. 2 is a phase interpolator that provides the signal $\alpha$ and the signal ($\alpha$+180°) to the edge output circuit 205 for example. As the phase interpolator 207, in addition to the phase interpolator in FIG. 2, a phase interpolator that provides the signal ($\alpha$+90°) and the signal ($\alpha$+270°) to the data output signal 204 is disposed. In other words, the phase interpolator 207 has two phase interpolators in FIG. 2.

Since the input buffer circuit 11 is an input circuit that inputs an input signal to the selector 21, it is provided corresponding to the selector 21. Since the input buffer 12 is an input circuit that inputs an input signal to the selector 22, it is provided corresponding to the selector 22. By contrast, the input buffer circuits 13 and 14 are input circuits that input a testing input signal to the testing selectors 31 and 32.

The input buffer circuit 11 provides a reference signal whose phase is different from the signal provided by the input buffer circuit 12 as a predetermined input signal to the selector 21 corresponding to the phase in the two selectors 21 and 22. Meanwhile, the input buffer circuit 11 provides a testing reference signal whose phase is different from signals input by the input buffer circuits 12-14 as a testing input signal to each of the plurality of testing selectors 31 and 32. In other words, the input buffer circuit 11 is an input circuit that receives input of a reference signal or a testing reference signal of a predetermined phase, inputs the input reference signal as an input signal to the selector 21, and inputs the input testing reference signal as a testing input signal to the selectors 31 and 32.

Specifically, the input buffer circuit 11 provides an input reference signal of phase 0° as an input signal to one of the selectors 21 corresponding to the phase 0°. Meanwhile, the input buffer circuit 11 provides an input testing reference signal of phase 0° as a testing input signal to each of the testing selectors 31 and 32.

For this reason, to the input buffer circuit 11, a test signal test 1 being a part of second control signals is input. The second control signals are test signals test 1-test 4, which are input from the control circuit 20. The test signals test 1-test 4 are set as "1" for testing and set as "0" for the system operation for example. In other words, test signals test 1-test 4=1 is the testing state, and test signals test 1-test 4=0 is the non-testing state. The test signals test 1-test 4 are described later.

During the system operation, the input buffer circuit 11 inputs an input signal of phase 0° to the selector 21 based on the second control signal (the test signal test 1=0), and stops output of the testing input signal to the testing selectors 31 and 32. In addition, during testing, the input buffer circuit 11 stops output of the input signal to the selector 21 and inputs the testing input signal of the phase 0° to the testing selectors 31 and 32, based on the second control signal (the test signal test 1=1).

The input buffer circuit 12 is a circuit that is similar the input buffer circuit 11. The input buffer circuit 12 provides a reference signal whose phase is different from the signal provided by the input buffer circuit 11 as a predetermined input signal to the selector 22 corresponding to the phase in the two selectors 21 and 22. Meanwhile, the input buffer circuit 12 provides a testing reference signal whose phase is different from signals input by the input buffer circuits 11, 13, 14 as a testing input signal to each of the plurality of testing selectors 31 and 32.

Specifically, the input buffer circuit 12 provides an input reference signal of phase 90° as an input signal to the input terminal of one of the selectors 22 corresponding to the phase 0°. Meanwhile, the input buffer circuit 12 provides an input testing reference signal of phase 90° as a testing input signal to each of the testing selectors 31 and 32.

For this reason, to the input buffer 12, a test signal test 2 being a part of second control signals is input. During the system operation, the input buffer circuit 12 inputs an input signal of phase 90° to the selector 22 based on the second control signal (the test signal test 2=0), and stops signal output to the testing selectors 31 and 32. In addition, during testing, the input buffer circuit 12 stops signal output to the selector 22 and inputs the testing input signal of the phase 90° to the testing selectors 31 and 32, based on the second control signal (the test signal test 2=1).

The input buffer circuit 13 provides a testing reference signal whose phase is different from signals input by the input buffer circuits 11, 12, 14 as a testing input signal to each of the plurality of testing selectors 31 and 32. In other words, the input buffer circuit 13 is an input circuit that receives input of a testing reference signal of a predetermined phase, and inputs the input testing reference signal to the testing selectors 31 and 32 as a testing input signal.

Specifically, the input buffer circuit 13 provides an input reference signal of phase 180° as a testing input signal to each of the testing selectors 31 and 32. For this reason, to the input buffer circuit 13, a test signal test 3 being a part of second control signals is input. During the system operation, the input buffer circuit 13 stops output of the testing input signal to the testing selectors 31 and 32 based on the second control signal (the test signal test 3=0). During testing, the input buffer circuit 13 inputs the testing input signal of the phase 180° to the testing selectors 31 and 32, based on the second control signal (the test signal test 3=1).

The input buffer circuit 14 is a circuit that is similar the input buffer circuit 13. The input buffer circuit 13 provides a testing reference signal whose phase is different from signals input by the input buffer circuits 11-13 as a testing input signal to each of the plurality of testing selectors 31 and 32.

Specifically, the input buffer circuit 14 provides an input reference signal of phase 270° as a testing input signal to each of the testing selectors 31 and 32. For this reason, to the input buffer 14, a test signal test 4 being a part of second control signals is input. During the system operation, the input buffer 14 stops output of the testing input signal to the testing selectors 31 and 32 based on the second control signal (the test signal test 4=0). During testing, the input buffer circuit 14 inputs the testing input signal of the phase 270° to the testing selectors 31 and 32, based on the second control signal (the test signal test 4=1).

The input buffer circuits 11-14 are, as described later, during testing, input signals whose phases are reverse from each other to the mixers 41 and 42 being differential circuits. For example, during testing when a testing input signal of phase 0° is input to the mixer 41 from the input buffer 11, a testing input signal of phase 180° being the reverse phase from the input buffer 13 needs to be input to the mixer 42. In this case, a testing input signal of phase 180° from the input buffer circuit 13 is input to the mixer 42. By providing the input buffer circuits 11-14, testing for various phases may be performed.

As described above, during the system operation, the input buffer circuits 11-14 stops output of the testing input signal to the testing selectors 31 and 32 based on the test signals test 1-test 4. Accordingly, during the system operation, the testing selectors 31 and 32 practically do not operate, making it possible to reduce the corresponding power consumption, Accordingly, during the system operation, the selectors are not affected from the testing input signal from the testing selectors 31 and 32 regardless of the value of selection signals sel 1 and sel 2, making it possible to prevent occurrence of noise due to the testing input signal. Furthermore, during the testing, the selectors 21 and 22 are not affected by the input signal from the input buffer circuits 11-14, making it possible to prevent occurrence of noise due to the input signal.

Here, the reference signals of different phases are signals having an advance amount of 0° and 90°, respectively. The reference signal is not a normal clock signal (rectangular wave) has a waveform that is almost equivalent to the sine wave, as described later with reference to FIG. 4 and FIG. 5. The reference signal is formed by rounding a clock signal (rectangular wave) from the PLL in a precedent circuit of the input buffer circuit 11 of the phase interpolator, for example.

Meanwhile, the testing reference signals of different phases are signals having an advance amount of 0°, 90°, 180°, 270°, respectively. The testing reference signal is a signal that is similar to the reference signal, and has a waveform that is almost equivalent to the sine wave. Accordingly, testing that matches the operation environment upon the actual system operation may be performed to especially the mixers 41 and 42 of the phase interpolator. The testing reference signal is formed by rounding a clock signal (rectangular wave) from the PLL in a precedent circuit of the input buffer circuit 11 of the phase interpolator, for example.

The testing selectors 31 and 32 selects a pair of (two) signals of reverse phases (phases that are different by 180°) from signals that have four kinds of the advance amount of different phases and uses the pair for the test. The frequency of the different phase signals is made equal to the frequency of the signal during system operation. The frequency of the signal during the system operation is determined by the specification of the semiconductor device. Accordingly, testing that matches the operation environment upon the actual system operation may be performed to especially the mixers 41 and 42 of the phase interpolator.

Since the selector 31 is a circuit that inputs a testing input signal to the selector 21, it is provided corresponding to the selector 21. Since the selector 32 is a circuit that inputs a testing input signal to the selector 22, it is provided corresponding to the selector 22.

To the testing selector 31, testing input signals whose phases are different from each other are input. The testing selector 31 outputs the testing input signal according to a part of first control signals. The first control signals are selection signals sel 1 and sel 2, which are input from the control circuit 20. The selection signals sel 1 and sel 2 are 2-bit signals for example. The selection signals sel 1 and sel 2 are described later.

For example, the testing selector 31 outputs one of the input 0°, 90°, 180°, 270° testing reference signals according to the first control signal (selection signal sel 1), and provides it to the other input terminal of the corresponding selector 21. For example, the testing selector 31 outputs the testing reference signal of phase 0° when the selection signal sel 1=00, outputs the testing reference signal of phase 90° when the selection signal sel 1=01, outputs the testing reference signal of phase 180° when the selection signal sel 1=11, and outputs the testing reference signal of phase 270° when the selection signal sel 1=10.

To the testing selector 32, testing input signals whose phases are different from each other are input. The testing selector 32 outputs the testing input signal according to a part of first control signals.

For example, the testing selector 32 outputs one of the input 0°, 90°, 180°, 270° testing reference signals according to the first control signal (selection signal sel 2), and provides it to the other input terminal of the corresponding selector 22. For example, the testing selector 32 outputs the testing reference signal of phase 0° when the selection signal sel 2=00, outputs the testing reference signal of phase 90° when the selection signal sel 1=01, outputs the testing reference signal of phase 180° when the selection signal sel 1=11, and outputs the testing reference signal of phase 270° when the selection signal sel 1=10.

Here, in order to input signals of reverse phases to the mixers 41 and 42 being differential circuits, at the time of testing, for example, when the testing input signal of phase 0° from the testing selector 31 is input to the mixer 41 via the selector 21, the testing input signal of phase 180° being the reverse phase needs to be input to the mixer 42. In this case, the testing selector 32 outputs the testing input signal of phase 180° from the input buffer circuit 13. For this reason, setting is made as the selection signal sel 1=00, and selection signal sel 2=11.

In the same manner, when the testing selector 31 outputs the testing input signal of phase 90° based on the selection signal sel 1=01, the testing selector 32 outputs the testing input signal of phase 270° based on the selection signal sel 2=10. When the testing selector 31 outputs the testing input signal of phase 180° based on the selection signal sel 1=11, the testing selector 32 outputs the testing input signal of phase 0° based on the selection signal sel 2=00. When the testing selector 31 outputs the testing input signal of phase 270° based on the selection signal sel 1=10, the testing selector 32 outputs the testing input signal of phase 90° based on the selection signal sel 2=01.

The selector 21 is provided corresponding to the testing selector 31 or the mixer 41. The selector 22 is provided corresponding to testing selector 32 or the mixer 42.

To the selector 21, an input signal (differential signal) from the input buffer circuit 11, and a testing input signal (differential signal) from the selector 31. The selector 21 outputs one of the input signal and the testing input signal output from the corresponding selector 31 according to a part of the second control signals.

For example, during the system operation, the selector 21 outputs the input signal of phase 0° input from the input buffer circuit 11 to the mixer 41 as output a (differential signal) according to the second control signal (test 1=0). During testing, the selector 21 outputs the testing input signal input from the testing selector 31 to the mixer 41 as output a (differential signal) according to the second test signal (test 1=1).

To the selector 22, an input signal (differential signal) from the input buffer circuit 12, and a testing input signal (differential signal) from the selector 31. The selector 22 outputs one of the input signal and the testing input signal output from the corresponding selector 32 according to a part of the second control signals.

For example, during the system operation, the selector 22 outputs the input signal of phase 90° input from the input buffer circuit 12 to the mixer 42 as output b (differential signal) according to the second control signal (test 2=0). During testing, the selector 22 outputs the testing input signal input from the testing selector 32 to the mixer 42 as output a (differential signal) according to the second test signal (test 2=1).

The mixer 41 is provided corresponding to the selector 21. To the mixer 41, output a of the corresponding selector 21 is input. The mixer 41 outputs a signal in which weighting is added to the output a of the corresponding selector 21 according to the third control signals.

In the same manner, the mixer 42 is provided corresponding to the selector 22. To the mixer 42, output b of the corresponding selector 22 is input. The mixer 42 outputs a signal in which weighting is added to the output b of the corresponding selector 22 according to the third control signals.

The third control signals are weighting signals c0 and c90, which are input from the weighting signal generation circuit 10. The weighting signals c0 and c90 are described later.

For example, to the mixer 41 corresponding to the reference signal having the advance amount of phase 0°, the weighting signal c0 is input. Accordingly, the output a of the selector 21 is made into a signal to which weighting is added (which is adjusted) according to the weighting signal c0, and is output from the mixer 41. In the same manner, the mixer 42 corresponding to the reference signal having an advance amount of phase 90° outputs a signal in which weighting is added to the output b of the selector 22 according to the weighting signal c90.

The output terminals of two mixers 41 and 42 are connected electrically to each other. Accordingly, an output signal e becomes a signal in which output of the mixer 41 before compounding and output of the mixer 42 before compounding are compounded. The output signal e is input to the amplification circuit 6 and the infinitesimal amplitude detection circuit 8. These signals are describe later with reference to FIG. 4 and FIG. 5.

To the signal line that connects the output terminals of the two mixers 41 and 42 mutually and to which the output signal e is output, the capacitor 5 that has a predetermined capacitance is connected in parallel according to the time constant of the frequency to be output. The current being the output signal e from the two mixers 41 and 42 charges the capacitor 5. Alternatively, the capacitor 5 may be provided inside the infinitesimal amplitude detection circuit 8.

The output circuit block is an output circuit block of the phase interpolator, and outputs the signal output from the output terminal of the mixers 41 and 42 as an output signal of the phase interpolator. The output circuit block includes an amplification circuit 6 and the output buffer circuit 7. The output circuit is a circuit that operates during the actual system operation and does not operate during testing. Meanwhile, the output circuit may be configured to operate also during testing.

The amplification circuit 6 amplifies the output signal e being compound output of the mixers 41 and 42, and inputs it to the output buffer circuit 7. The output buffer circuit 7 takes in the output signal e that has been amplified by the amplification circuit 6, and drives it as the output signal of the phase interpolator.

The detection circuit block is an error detection circuit clock of the phase interpolator, and detects fluctuation of the amplitude of the signal output from the output terminal of the plurality of mixers, and output an error signal. The detection circuit clock includes the infinitesimal amplitude detection circuit 8 and the result storage circuit 9. The detection circuit clock is a circuit block that does not operate during the system operation and operates during testing.

The infinitesimal amplitude detection circuit 8 detects fluctuation in the amplitude of the output signal e being compound output of the mixers 41 and 42. For example, the infinitesimal amplitude detection circuit 8 includes a comparison circuit. The infinitesimal amplitude detection circuit 8 compares the output signal e of the mixers 41 and 42 with a threshold value, and when output signal e is larger than the threshold value, generates an error signal and outputs it to the result storage circuit 9. The error signal is set as "1" when the output signal e is larger than the threshold value for example. The error signal is not generated (set as "0") in other cases. The threshold value is set in advance. The threshold value may be determined empirically. As the threshold value, a voltage signal Vref is used. Therefore, the voltage signal Vref is input to the infinitesimal amplitude detection circuit 8.

Actually, the infinitesimal amplitude detection circuit 8 compares the absolute value of the output signal e of the mixers 41 and 42 with the threshold value. This is because the value of the output signal e is either a positive value or a negative value depending on the output of the two mixers. Accordingly, an error signal may be generated when the amplitude of the output signal e is larger than a predetermined value (threshold value).

The result storage circuit 9 includes a holding circuit such as a flip flop circuit for example. The result storage circuit 9 takes in an error signal from the infinitesimal amplitude detection circuit 8. When the result storage circuit 9 once takes in the error signal, it holds it until being reset. Accordingly, when the error signal is detected once or more during testing for all the mixers 41 and 42, result output f becomes an error. The result storage circuit 9 keeps outputting the error signal as the result output f. The result output f indicates the test result of the phase interpolator in the function test.

The weighting signal generation circuit 10 is a signal generation circuit that generates the third control signals. The control signals are weighting signals c0 and c90 that determine the phase of the output signal output from the output circuit during the system operation.

For example, the signal of phase 45° is generated from the reference signal of phase 0° and the reference signal of phase 90° as above. In this case, the weighting signals c0 and c90 for the mixers 41 and 42 are made to be equal. Accordingly, the reference signal of phase 0° input to the mixer 41 and the reference signal of phase 90° input to the mixer 42 are compounded at an equal ratio, and the output signal e of phase 45° is generated and output from the output buffer circuit 7.

During the system operation, the weighting signals c0 and c90 are set as predetermined values determined according to the advance amount of the phase set for the output signal of the output buffer circuit 7. Therefore, the value of the weighting signals c0 and c90 takes various values.

During testing, the weighting signals c0 and c90 are set to be values to select the two mixers to be tested. Therefore, the weighting signals c0 and c90 for the two mixers 41 and 42 to be tested are made (1:1) equally.

The control signal 20 generates the first control signals sel 1 and sel 2 and the second control signals test 1-test 4. The control signal 20 may be formed to be integrated with the weighting signal generation circuit 10. The first control signal and the second control signal may be generated in separate control circuits.

The selection signals sel 1 and sel 2 being the first control signals are signals for selecting one of the testing input signals during testing. During testing, the selection signals sel 1 and sel 2 are set to be predetermined values during testing, as described above. The selection signal sel 1 is input to the testing selector 31 and controls it. The selection signal sel 2 is input to the testing selector 32 and controls it.

The test signals test 1-test 4 being the second control signals are signals for input buffer circuits 11-14 to output the reference signal as the input signal and to stop output to the testing selectors during the system operation. In addition, the test signals test 1-test 4 being the second control signals are signals for the selectors to select the testing input signal output from the corresponding testing selectors during testing. The testing signals test 1-test 4 are 2-bit signals that are set to be one of the values 00, 01, 11, 01. The testing signals test 1-test4 may be generated using the TMS (Test Mode Select) signal in the JTAG signal defined in IEEE1149.1, for example. The test signal test 1 is input to the input buffer circuit 11 and the selector 21, and controls them. The test signal test 2 is input to the input buffer circuit 12 and the selector 22, and controls them. The test signal test 3 is input to the input buffer circuit 13 and controls it. The test signal test 4 is input to the input buffer circuit 14 and controls it.

As described above, during the system operation of the phase interpolator, the test signals test 1-test 4 are set to "0", that is, the "non-test state" for example. Accordingly, the input buffer circuit 11 inputs the reference signal of phase 0 to the corresponding selector 21. In addition, the input buffer circuit 12 inputs the reference signal of phase 90° to the corresponding selector 22. Meanwhile, none of the input buffer circuits 11-14 inputs the signal to the testing selectors 31 and 32. Meanwhile, the combination of two reference signals may also be the combination of phase 90° and phase 180°, phase 180° and phase 270°, phase 270° and phase 0°.

In addition, during the system operation, the selection signals sel 1 and sel 2 may take any value. Since there is no signal input from the input buffer circuits 11-14, the two testing selectors 31 and 32 practically do not output any signal.

Meanwhile, during the system operation, according to the test signal test 1=0, the selector 21 selectively outputs the input signal from the corresponding input buffer circuit 11. According to the test signal test 2=0, the selector 22 selectively outputs the input signal from the corresponding input buffer circuit 12.

Meanwhile, during the system operation, the weighting signals c0 and c90 are set to be predetermined values determined according to the advance amount of the phase set for the output signal of the output buffer circuit 7. Accordingly, the two mixers 41 and 42 outputs signals in which weighting is added to output a and b of the corresponding selectors 21 and 22. As a result, the output signal e in which the signals in which weighting is added to the output a and b are compound is amplified and output from the output buffer circuit 7.

On the other hand, during the function test of the phase interpolator, the test signals test 1-test 4 are set to "1", that is, the "test state". Accordingly, neither of the input buffer circuits 11 and 12 inputs any signal to the selectors 21 and 22. In addition, the input buffer circuit 11 inputs the testing reference signal having the advance amount of phase 0° to the testing selectors 31 and 32. The input buffer circuit 12 inputs the testing reference signal having the advance amount of phase 90° to the testing selectors 31 and 32. The input buffer circuit 13 inputs the testing reference signal having the advance amount of phase 180° to the testing selectors 31 and 32. The input buffer circuit 14 inputs the testing reference signal having the advance amount of phase 270° to the testing selectors 31 and 32.

Meanwhile, according to the test signal test 1=1, the selector 21 outputs the testing input signal output from the corresponding testing selector 31. In the same manner, according to the test signal test 2=1, the selector 22 outputs the testing input signal output from the corresponding testing selector 32.

Meanwhile, during testing, the selection signals sel 1 and sel 2 are set to be one of the values 00, 01, 11, 10. Accordingly, the two testing selectors 31 and 32 outputs the testing input signal as described above. At this time, according t the selection signals sel 1 and sel 2, the two testing selectors 31 and 32 outputs the testing input signals whose phases are reverse from each other, as described above. In other words, the selection signals sel 1 and sel 2 are set so that the two testing selectors 31 and 32 output testing input signals whose phases are reverse from each other. As a result, the two selectors 21 and 22 corresponding to two testing selectors 31 and 32 output the testing input signals output from the two testing selectors 31 and 32. As a result, during testing, the output a and output b of the two selectors 21 and 22 are set to be in reverse phases.

In addition, during testing, the weighting signals c0 and c90 are set to be predetermined values. Accordingly, two mixers output testing input signals output from two selectors according to the weighting signals c0 and c90. Accordingly, the two mixers 41 and 42 output signals in which equal weighting is added to the output a and b of the corresponding testing selectors 31 and 32. As a result, the detection circuit outputs an error signal when the absolute value of the output signal e in which the signals in which weighting is added to the output a and b are compounded is larger than the threshold value.

Figure 3:
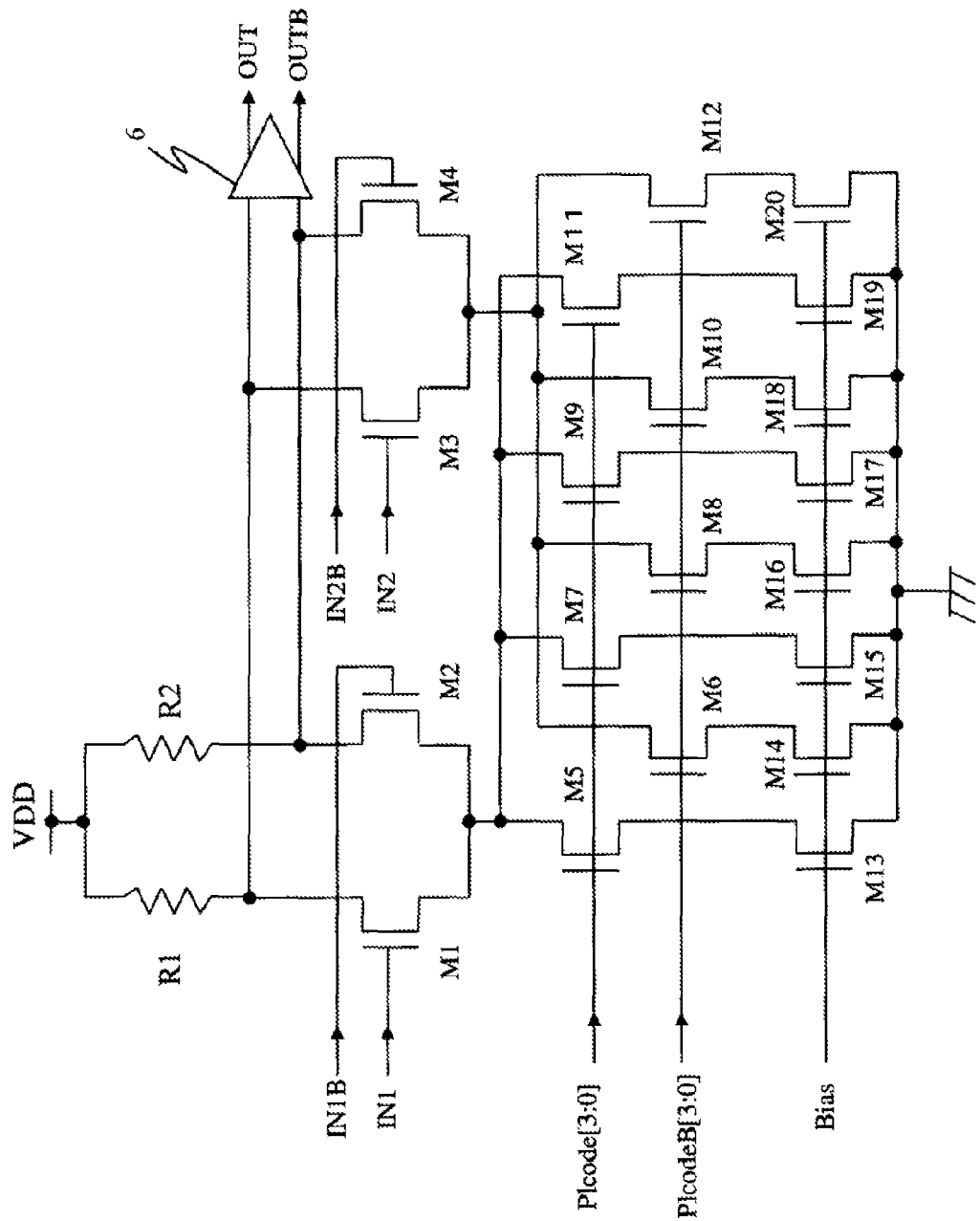
FIG. 3 is a diagram illustrating an example of a mixer.

FIG. 3 is a diagram illustrating an example of the mixer of the phase interpolator.

The mixers 41 and 42 each include two differential circuits (differential pairs), eight current sources, and eight control switches using MOSFET (Metal Oxide Semiconductor Field Effect Transistor). The number of the current sources and the control switches varies as needed according to the resolution upon generating an arbitrary phase signal. The two differential circuits correspond to the mixers 41 and 42. Therefore, the mixers 41 and 42 are formed to be integrated as illustrated with a dotted line in FIG. 2. Meanwhile, in FIG. 3, the amplification circuit 6 is illustrated together, and the capacitor 5 is omitted.

The two differential circuits include resistances R1 and R2 being the load shared among them, a first differential circuit including N channel MOS transistors (FET) M1 and M2, and a second differential circuit including M3 and M4. To the gate electrode of the M1, an input signal IN1 is applied. In the same manner, an input signal IN2 is applied to the gate electrode of the M2, an input signal IN3 is applied to the gate electrode of the M3, an input signal IN4 is applied to the gate electrode of the M4. IN1B is an inversion signal of the IN1. IN2B is an inversion signal of the IN2. At the connection points of the resistances R1 and R2 and M1, M2, M3, M4, differential output OUT and OUTB is connected. The differential output OUT and OUTB is input to the amplification circuit 6 and the infinitesimal amplitude detection circuit 8.

For example, the IN1 is a reference signal or a testing reference signal (hereinafter, referred to as the reference signal and the like) of phase 0°, IN1B is a signal (reference signal) and the like of phase 180°, IN2 is a signal (reference signal) and the like of phase 90°, and IN2B is a signal (reference signal) and the like phase 270°. In other words, IN1 is the output a of the selector 21, and IN1B is a signal of the reverse phase of the output a, IN2 is the output b of the selector 22, and IN2*b* is a signal of the reverse phase of the output b.

The eight current sources include M13-M20. To the gate electrode of the M13-M20, a bias voltage Bias is applied. To the source electrode of the M13-M20, a ground potential is connected. Between the drain electrode of the current sources M13-M20 and the first and second differential circuits, control signals including M5-M12 corresponding respectively to the current sources. The first differential circuit is driven by the current sources M13, M15, M17, M19. The second differential circuit is driven by the current sources M14, M16, M18, M20.

The eight control switches include M5-M12 provided corresponding to the eight current sources. To the gate electrode of the control switches M5, M7, M9, M11, a 4-bit control signal PIcode [3:0] is applied. Each bit of the PIcode [3:0] is applied to one of the control switches M5, M7, M9, M11 that is associated in advance. For example, the bit PIcode is applied to the control switch M5, the bit PIcode [2] is applied to the control switch M7, the bit PIcode [1] is applied to the control switch M9, and the bit PIcode [0] is applied to the control switch M11. To the gate electrode of the control switches M6, M8, M10, M12, a 4-bit control signal PIcodeB [3:0] is applied. Each bit of the PIcodeB [3:0] is applied to one of the control switches M6, M8, M10, M12 that is associated in advance. For example, the bit PIcodeB [3] is applied to the control switch M6, the bit PIcodeB [2] is applied to the control switch M8, the bit PIcodeB [1] is applied to the control switch M10, and the bit PIcodeB [0] is applied to the control switch M12. The PIcodeB [3:0] is an inverse signal of the PIcode [3:0]. The PIcodeB [3:0] and the PIcode [3:0] is the weighting signals c0 and c90 input from outside of the mixers 41 and 42.

The control switches M5 and M6, M7 and M8, M9 and M10, M11 and M12 are made to be a pair. Therefore, to the gate electrodes of the control switches that are made to be a pair, signals being in the reverse relationship from each other are applied. Accordingly, when one of the switches that are made to be a pair is on, the other is set to be off.

For example, as described above, when a signal of phase 90° is generated from the reference signal of phase 0° and the reference signal of phase 90°, the mixers 41 and 42 are controlled as follows.

In the first differential circuit, to the IN1, the output a of the selector 21 being the reference signal of phase 0° is applied, and to the IN1B, a signal of the reverse phase of the output a is applied. In the second differential circuit, to IN2, the output b of the selector 22 being the reference signal of phase 90° is applied, and a signal of the reverse phase of the output b is applied to the IN2B.

Meanwhile, for example, the PIcode [3:0] provided to the control switches M5, M7, M9, M11 corresponding to the first differential circuit is set as (1, 1, 0, 0), and the PIcodeB [3:0] provided to the control switches M6, M8, M10, M12 corresponding to the second differential circuit is set as (0, 0, 1, 1). This is equivalent to making the weighting signal c0 for the IN1 and the weighting signal c90 for the IN2 equal.

Accordingly, the M5 and M7 are turned on, and the M9 and M11 are turned off. Meanwhile, M6 and M8 are turned off, mad the M10 and M12 are turned on. As a result, an equal magnitude of drive current flows in the first differential circuit and the second differential circuit. Accordingly, the reference signal of phase 0° being the IN1 and the reference signal of phase 90° being the IN2 are compounded at an equal ratio, the output signal e of phase 45° is generated and output to the differential output OUT from the amplification circuit 6. At this time, a signal having the reverse phase 225° of the output signal e is output to the differential output OUTB.

Meanwhile, for example, when a signal of phase 22.5° is generated from the reference signal of phase 0° and the reference signal of phase 90°, the PIcode [3:0] is set as (1, 1, 1, 0), and the PIcodeB [3:0] is set as (0, 0, 0, 1). This is equivalent to setting the weighting of the weighting signal c0 for the IN1 and the weighting signal c90 for the IN2 as 3:1, and the weighting of the weighting signal c180 for the IN1B and the weighting signal c270 for IN2B as "0".

As illustrated above, the phase of the output signal of the phase interpolator is directly affected by the operation characteristics of the MOSFET being the circuit element of the mixers 41 and 42, for example the delay, current voltage characteristics, frequency characteristics and the like. Therefore, it is important to test particularly the dynamic characteristics of the mixers 41 and 42.

Figure 4:
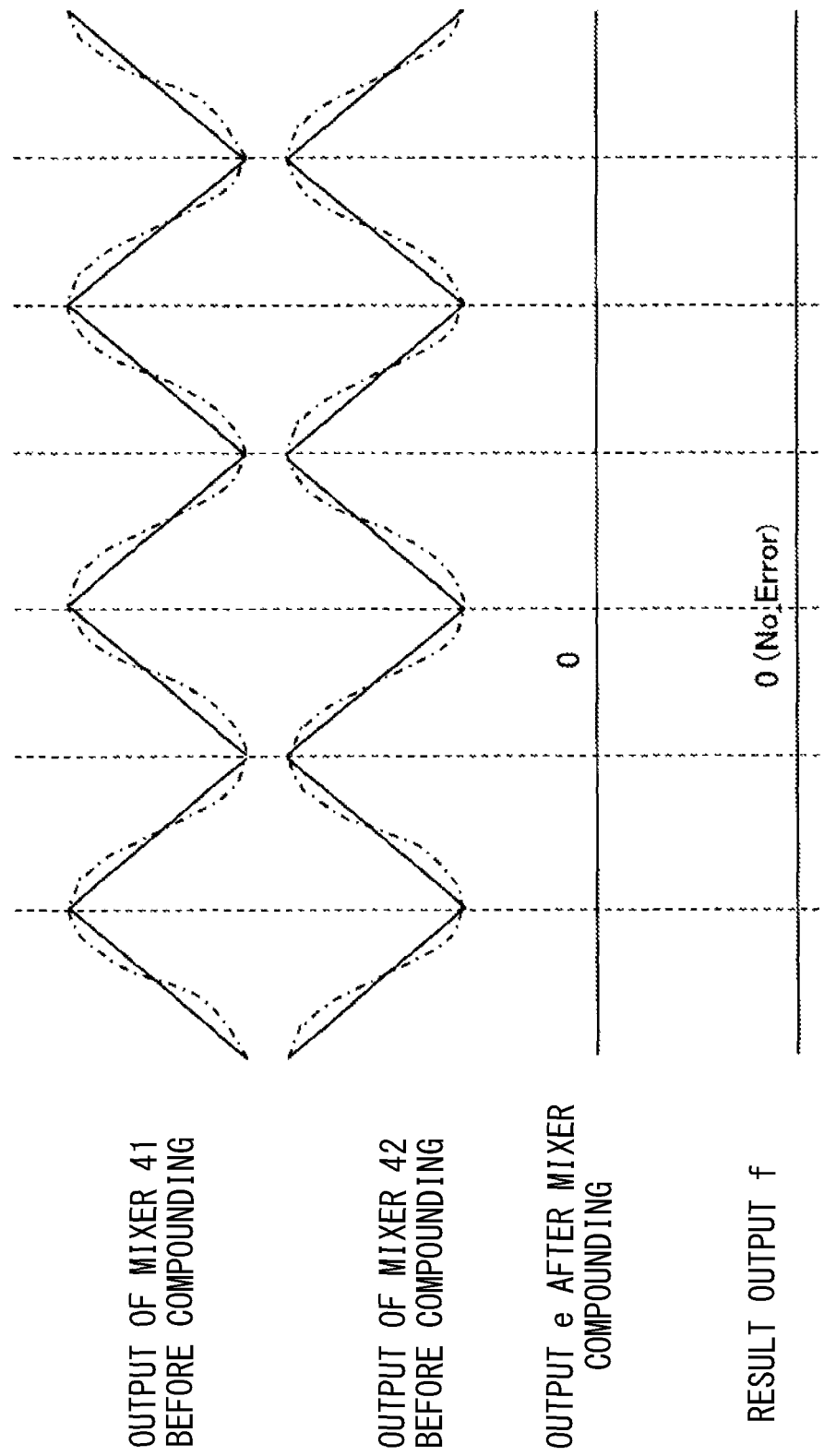
FIG. 4 is an illustration diagram of operations upon a phase interpolator test.
Figure 5:
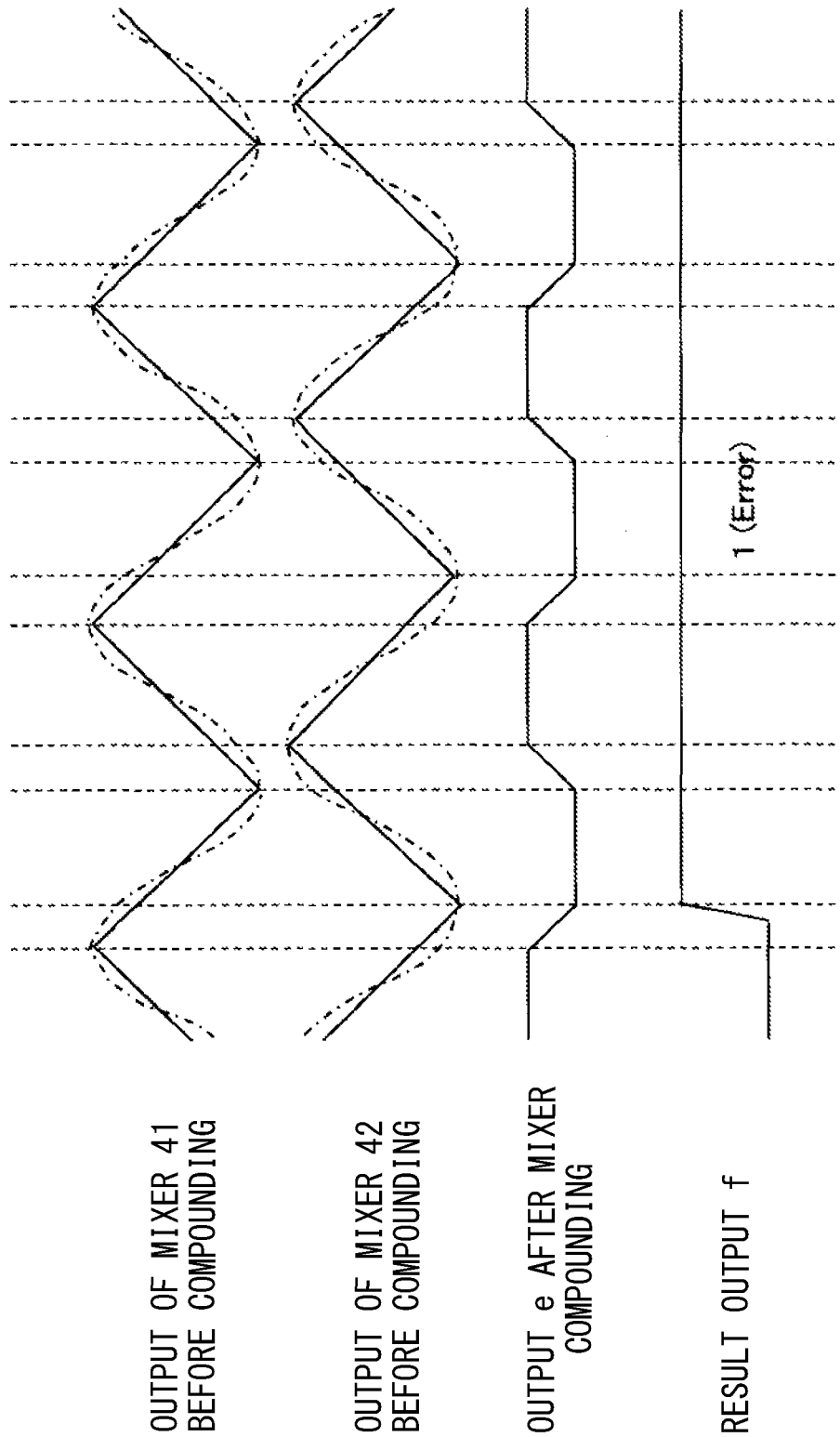
FIG. 5 is an illustration diagram of operations upon a phase interpolator test.

FIG. 4 and FIG. 5 are operation illustration diagrams of the phase interpolator during testing. FIG. 4 particularly illustrates the case in which the dynamic characteristics of the phase interpolator are normal, and FIG. 5 illustrates the case in which the dynamic characteristics of the phase interpolator are abnormal.

In FIG. 4 and FIG. 5, the "output of mixer 41 before compounding" is the standalone output of the mixer 41 in a case in which it is assumed that the output of the mixer 41 is not compounded with the output of the mixer 42. The "output of mixer 42 before compounding" is the standalone output of the mixer 42 in a case in which it is assumed that the output of the mixer 42 is not compounded with the output of the mixer 41. The "output of mixer 41 before compounding" and "output of mixer 42 before compounding" are, actually, signals that cannot be obtained as output.

Meanwhile, the "output (output signal) e after mixer compounding" represents the output after the output of the mixer 41 and the output of the mixer 42 are compounded. The "output e after mixer compounding" is a signal that can actually be obtain as output. The "output of mixer 41 before compounding" and "output of mixer 42 before compounding" are presented to explain change in the level of the "output e after mixer compounding". The "output of mixer 41 before compounding" and "output of mixer 42 before compounding" are, basically, signals in reverse phases.

The "output of mixer 41 before compounding" is not a normal clock signal, that is, a rectangular wave, and as illustrated in FIG. 4 with a dashed-dotted line, becomes a waveform that is almost equivalent to a sine wave. This is because, as described above, the signal input to the mixer has a waveform that is almost equivalent to the sine wave.

The "output of mixer 42 before compounding" is not a normal clock signal, that is, a rectangular wave, either for the same reason and becomes a waveform that is almost equivalent to a sine wave.

Meanwhile, in FIG. 4 and FIG. 5, in order to compare signals in reverse phases, the position of the peak of each signal is indicated with a dotted line.

In addition, when considering the compounding of "output of mixer 41 before compounding" and "output of mixer 42 before compounding" since both become a waveform that is almost equivalent to a sine wave, consideration can be made with approximation using a triangular wave. Therefore, as illustrated in FIG. 4 and FIG. 5 with a solid line, for the "output of mixer 41 before compounding" and "output of mixer 42 before compounding" that has a waveform almost equivalent to a sine wave, a waveform that has been approximated using a triangular wave is presented.

During testing, the test signals test 1-test 4=1 is set. Accordingly, the input buffer circuits 11-14 input the testing reference signals of phase 0°, 90°, 180° and 270° to the testing selectors 31 and 32. Meanwhile, the selectors 21 and 22 outputs the signal from the testing selectors 31 and 32 based on the test signals test 1 and test 2=1.

Meanwhile, the selection signals sel 1 and sel 2 are set as a predetermined value. For example, setting is made as the selection signal sel 1=00, and selection signal sel 2=11.

Accordingly, the testing selector 31 outputs a signal of phase 0°, and the testing selector 32 outputs a signal of phase 180°. That is, as testing input signals, signals in reverse phases are used. The weighting signals c0 and c90 are set to make the weighting of the output a and the output b of the selector 21 and the selector 22 equal.

According to the above, the mixers 41 and 42 corresponding to the selectors 21 and 22 are selected as the direct testing target. Meanwhile, in practice, testing is to be directly performed for the selectors 21 and 22, the testing selectors 31 and 32 corresponding to them and the input buffer circuits 11 and 12 as well.

Next, the selection signals sel 1 and sel 2 are switched. Accordingly, for example, the testing selector 31 is made to output the testing input signal of phase 90° based on the selection signal sel 1=01 and the testing selector 32 is made to output the testing input signal of phase 270° based on the selection signal sel 2=10. Testing is performed in this state.

Next, the selection signals sel 1 and sel 2 are switched further. Accordingly, for example, the testing selector 31 is made to output the testing input signal of phase 180° based on the selection signal sel 1=11 and the testing selector 32 is made to output the testing input signal of phase 0° based on the selection signal sel 2=00. Testing is performed in this state.

Next, the selection signals sel 1 and sel 2 are switched further. Accordingly, for example, when the testing selector 31 outputs the testing input signal of phase 270° based on the selection signal sel 1=10, the testing selector 32 outputs the testing input signal of phase 90° based on the selection signal sel 2=01. Meanwhile, only a part of the testing above may also be performed.

In FIG. 4, since the dynamic characteristics of the phase interpolator is normal, assuming the output of the mixer 41 before compounding as a signal of phase 0°, the output of the mixer 42 before compounding becomes a signal of phase 180°. In other words, the output of the mixer 41 before compounding and the output of the mixer 42 before compounding have reverse phases as illustrated in FIG. 4. Therefore, the voltage level of the output signal e in which the output of the mixer 41 and the output of the mixer 42 are compounded becomes "0".

Since the output signal e is smaller than the threshold value, the infinitesimal amplitude detection circuit 8 outputs 0 (No_Error) as a result output f to the result storage circuit 9. As a result, the result storage circuit 9 outputs the result output f (No_Error) as the test result of the phase interpolator. Accordingly, the dynamic characteristics of the phase interpolator being normal can be verified. Specifically, the input buffer circuits 11 and 12, the testing selector 31 and 32, the selectors 21 and 22, the mixers 41 and 42 being normal can be verified.

On the other hand, in FIG. 5, since the dynamic characteristics of the phase interpolator are abnormal, assuming the output of the mixer 41 as phase 0°, the output of the mixer 42 before compounding becomes a signal that is shifted from the phase 180°. In other words, the output of the mixer 41 before compounding and the mixer 42 before compounding do not have reverse phases as illustrated in FIG. 5. Therefore, the voltage level of the output signal e in which the output of the mixer 41 and the output of the mixer 42 are compounded does not become "0", and becomes a positive value or a negative value according to the degree of the anomaly.

Since the output signal e is larger than the threshold value, the infinitesimal amplitude detection circuit 8 for example outputs 1 (Error) as a result output f to the result storage circuit 9. As a result, the result storage circuit 9 outputs the result output f (Error) as the test result of the phase interpolator.

Accordingly, the dynamic characteristics of the phase interpolator being abnormal can be verified. Specifically, the input buffer circuits 11 and 12, the testing selector 31 and 32, the selectors 21 and 22, the mixers 41 and 42 being abnormal can be verified.

Figure 6:
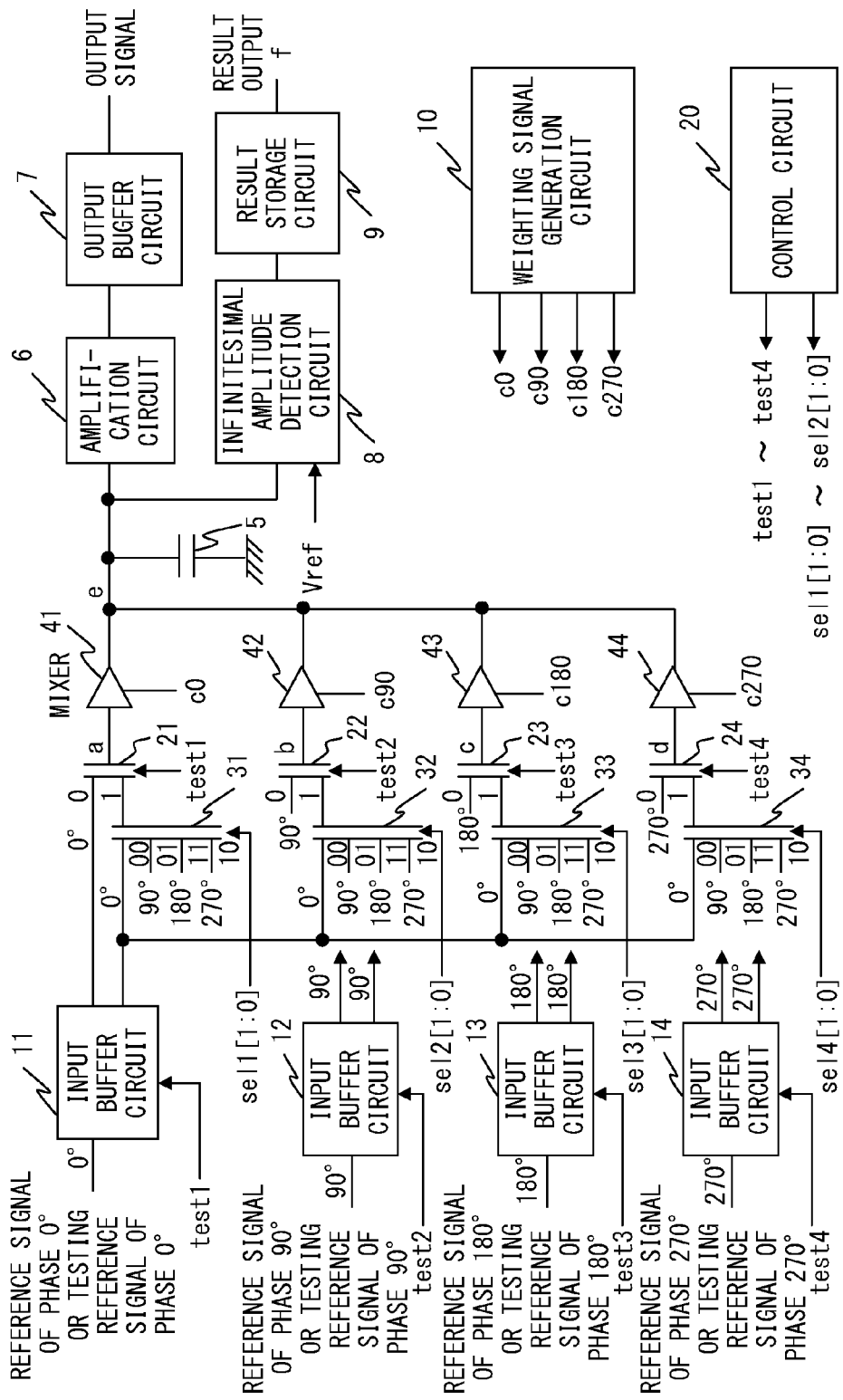
FIG. 6 is a diagram illustrating another example of a phase interpolator.

FIG. 6 is a diagram illustrating another example of the phase interpolator.

The semiconductor device, that is, the phase interpolator in FIG. 6 has four input buffer circuits 11-14, four selectors 21-24, four testing selectors 31-34, four mixers 41-44. The phase interpolator in FIG. 6 uses four different reference signals of difference phases as predetermined input signals of different phases. In practice, in mixing four reference signals, two reference signals that has closer phases to the desired phase are used. As the four reference signals of different phases, reference signals of phase 0°, 90°, 180°, 270° are used.

The number of testing reference signals of different phases (the number of different phases) is set as the number corresponding to the reference signals of different phases. As the plurality of testing input signals, signals of phases that are different from each other are input. Specifically, four signals of phase 0°, 90°, 180°, 270° are input, and two signals of reverse phases (phases that are different by 180°) are selected and used for the test.

To the four input buffer circuits 11-14, as second control signals, test signals test 1-test 4 are input respectively. To the four selectors 21-24, as the second control signals, the test signals test 1-test 4 are input respectively. To the four testing selectors 31-34, as first control signals, selection signals sel 1-sel 4 are input respectively. To the four mixers 41-44, as third control signals, weighting signals c0, c90, c180 and c270 are input respectively. The test signals test 1-test 4 and the selection signals sel 1-sel 4 are generated by the control circuit 20. The weighting signals c0, c90, c180 and c270 are generated by the weighting signal generation circuit 10.

Since the input buffer circuits 11-14 are input circuits that respectively input the input signals to the selectors 21-24, they are provided corresponding to the selectors 21-24. Since the testing selectors 31-34 are input circuits that input the testing input signals to the testing selectors 31-34, they are provided corresponding to the selectors 21-24.

The input buffer circuits 11 and 12 of the phase interpolator in FIG. 6 are circuits similar to the input buffer circuits 11 and 12 of the phase interpolator in FIG. 2.

Therefore, during the system operation, the input buffer circuit 11 inputs the input signal of phase 0° to the selector 21 and stops signal output to the testing selectors 31-34, based on the second control signal (test signal test 1=0). Meanwhile, during testing, the input buffer circuit 11 stops signal output to the selector 21 and inputs the testing input signal of phase 0° to the testing selectors 31-34, based on the second control signal (test signal test 1=1).

During the system operation, the input buffer circuit 12 inputs the input signal of phase 90° to the selector 22 and stops signal output to the testing selectors 31-34, based on second control signal (test signal test 2=0). During testing, the input buffer circuit 12 stops signal output to the selector 22 and inputs the testing input signal of phase 90° to the testing selectors 31-34, based on the second control signal (test signal test 2=1).

Meanwhile, the input buffer circuits 13 and 14 of the phase interpolator in FIG. 6 are circuits similar to the input buffer 11 or 12 of the phase interpolator in FIG. 2.

Therefore, during the system operation, the input buffer circuit 13 inputs the input signal of phase 180° to the selector 23 and stops signal output to the testing selectors 31-34, based on the second control signal (test signal test 3=0). During testing, the input buffer circuit 13 stops signal output to the selector 23 and inputs the testing input signal of phase 180° to the testing selectors 31-34, based in the second control signal (test signal test 3=1).

During the system operation, the input buffer circuit 14 inputs the input signal of phase 270° to the selector 24 and stops signal output to the testing selectors 31-34, based on the second control signal (test signal test 4=0). During testing, the input buffer circuit 14 stops signal output to the selector 24 and inputs the testing input signal of phase 270° to the testing selectors 31-34, based in the second control signal (test signal test 4=1).

The testing selectors 31 and 32 of the phase interpolator in FIG. 6 are circuits similar to the testing selectors 31 and 32 of the phase interpolator in FIG. 2.

Therefore, the testing selector 31 outputs the testing reference signal of phase 0° when the selection signal sel 1=00, outputs the testing reference signal of phase 90° when the selection signal sel 1=01, outputs the testing reference signal of phase 180° when the selection signal sel 1=11, and outputs the testing reference signal of phase 270° when the selection signal sel 1=10.

The testing selector 32 outputs the testing reference signal of phase 0° when the selection signal sel 2=00, outputs the testing reference signal of phase 90° when the selection signal sel 2=01, outputs the testing reference signal of phase 180° when the selection signal sel 21=11, and outputs the testing reference signal of phase 270° when the selection signal sel 2=10.

The testing selectors 33 and 34 of the phase interpolator in FIG. 6 are circuits similar to the testing selector 31 or 32 of the phase interpolator in FIG. 2.

Therefore, the testing selector 33 outputs the testing reference signal of phase 0° when the selection signal sel 3=00, outputs the testing reference signal of phase 90° when the selection signal sel 3=01, outputs the testing reference signal of phase 180° when the selection signal sel 3=11, and outputs the testing reference signal of phase 270° when the selection signal sel 3=10.

The testing selector 34 outputs the testing reference signal of phase 0° when the selection signal sel 4=00, outputs the testing reference signal of phase 90° when the selection signal sel 4=01, outputs the testing reference signal of phase 180° when the selection signal sel 4=11, and outputs the testing reference signal of phase 270° when the selection signal sel 4=10.

The selectors 21 and 22 of the phase interpolator in FIG. 6 are circuits similar to the selectors 21 and 22 of the phase interpolator in FIG. 2.

Therefore, during the system operation, the selector 21 outputs the input signal of phase 0° input from the input buffer circuit 11 to the mixer 41 as an output a (differential signal), according to the second control signal (test 1=0). During testing, the selector 21 outputs the testing input signal input from the testing selector 31 to the mixer 41 as an output a (differential signal), according to the second control signal (test 1=1).

During the system operation, the selector 22 outputs the input signal of phase 90° input from the input buffer circuit 12 to the mixer 42 as an output b (differential signal), according to the second control signal (test 2=0). During testing, the selector 22 outputs the testing input signal input from the testing selector 32 to the mixer 42 as an output b (differential signal), according to the second control signal (test 2=1).

The selectors 23 and 24 of the phase interpolator in FIG. 6 are circuits similar to the selector 21 or 22 of the phase interpolator in FIG. 2.

Therefore, during the system operation, the selector 23 outputs the input signal of phase 180° input from the input buffer circuit 13 to the mixer 43 as an output c (differential signal), according to the second control signal (test 3=0). During testing, the selector 23 outputs the testing input signal input from the testing selector 33 to the mixer 43 as an output c (differential signal), according to the second control signal (test 3=1).

During the system operation, the selector 24 outputs the input signal of phase 270° input from the input buffer circuit 14 to the mixer 44 as an output d (differential signal), according to the second control signal (test 4=0). During testing, the selector 24 outputs the testing input signal input from the testing selector 34 to the mixer 44 as an output d (differential signal), according to the second control signal (test 4=1).

The mixers 41 and 42 of the phase interpolator in FIG. 6 are circuits similar to the mixers 41 and 42 of the phase interpolator in FIG. 2.

Therefore, according to the third control signal (weighting signal c0), the mixer 41 outputs a signal in which weighting is added according to the weighting signal c0 to the output a of the corresponding selector 21. According to the third control signal (weighting signal c90), the mixer 42 outputs a signal in which weighting is added according to the weighting signal c90 to the output b of the corresponding selector 22.

The mixers 43 and 44 of the phase interpolator in FIG. 6 are circuits similar to the mixers 41 and 42 of the phase interpolator in FIG. 2.

Therefore, according to the third control signal (weighting signal c180), the mixer 43 outputs a signal in which weighting is added according to the weighting signal c180 to the output c of the corresponding selector 23. According to the third control signal (weighting signal c270), the mixer 44 outputs a signal in which weighting is added according to the weighting signal c270 to the output d of the corresponding selector 24.

The respective output terminals of the four mixers 41-44 are electrically connected to each other. Accordingly, the output signal e becomes a signal in which the output of these mixers 41-44 are compounded.

During the system operation of the phase interpolator in FIG. 6, the input buffer circuits 11-14 inputs the reference signal of phase 0°, 90°, 180°, 270° as an input signal to the corresponding selector 21-24 and does not output any signal to the testing selectors 31-34, based on the test signal test 1-test 4=0. Since there is no input to the testing selectors 31-34, the selection signals sel 1-sel 4 may take any value. The mixers 41-44 outputs the signal from the selectors 21-24, based on the test signals test 1=test 4=0. The weighting signals c0, c90, c180, c270 are set as predetermined values determined according to the phase that the output signal of the output buffer circuit 7 takes. According to the above, the mixers 41-44 outputs a signal in which weighting is added to the output a-d of the corresponding selector 21-24. As a result, the output signal e in which signals to which weighting is added to the output a-d are compounded is amplified and output from the output buffer circuit 7.

In practice, during the system operation, the four selectors 21-24 outputs the output a-d in parallel. Meanwhile, the phase that the output signal of the output buffer circuit 7 should take is generated using two reference signals that have closer phases to it. For example, as described above, a signal of phase 45° is generated from the reference signal of phase 0° and the reference signal of phase 90°. Therefore, the mixers 41-44 are provided with the weighting signals c0, c90, c180 and c270 needed for generating the signal of phase 45°, and outputs a signal in which the output a and the output b are compounded at an equal ratio as the output signal e of phase 45°.

In this case, the weighting signals c0 and c90 for the mixers 41 and 42 are made set to be equal, and the weighting signals c180 and c270 for the mixers 43 and 44 are set to "0". Accordingly, the signal (output a) of phase 0° input to the mixer 41 and the signal (output b) of phase 90° input to the mixer 42 are compounded at an equal rate, and the signal (output c) of phase 180° input to the mixer 43 and the signal (output d) of phase 270° input to the mixer 44 are made not to affect the output signal e. As a result, the output signal e of phase 45° is generated and output from the output buffer circuit 7.

Meanwhile, during testing of the semiconductor apparatus, that is, the phase interpolator in FIG. 6, the input buffer circuits 11-14 inputs signals being testing reference signals of phase 0°, 90°, 180°, 270° as testing input signals to the testing selectors 31-34, based on the test signals test 1-test 4=1, and do not output any signal to the selectors 21-24. The selection signals sel 1-sel 4 are set to predetermined values as follows. The mixers 41-44 outputs the signals from the testing selectors 31-34 input via the selectors 21-24, based on the test signals test 1-test 4=1. The weighting signals c0, c90, c180, c270 are set to predetermined values as follows. According to the above, the mixers 41-44 outputs a signal in which weighting is added to the output a-d of the corresponding selectors 21-24. As a result, the output signal e in which the signals in which weighting is added to the output a-d are compounded is amplified and output from the output buffer circuit 7.

During testing, for example, when the testing input signal of phase 0° from the input buffer circuit 11 is output from the mixer 41 via the testing selector 31 and the selector 21, the testing input signal of phase 180° being the reverse phase needs to be output from one of the mixers 42-44. In other words, in this case, the testing input signal of phase 180° from the input buffer circuit 13 is output from one of the mixers 42-44 via one of the testing selectors 32-34 and one of the selectors 22-24.

Thus, according to the selection signals sel 1-sel 4, two testing selectors selected from the four testing selectors 31-34 output testing input signals that are in reverse phases from each other. For this reason, the selection signals sel 1-sel 4 are set so that two testing selectors output testing input signals that are in reverse phases from each other. As a result, two selectors corresponding to the selected two testing selectors output the testing input signals output from the two testing selectors.

As described above, two selectors that output the testing input signals and two mixers corresponding to them are the selectors and mixers that are set as the test target.

During testing, the weighting signals c0, c90, c180, c270 are set to values to select two mixers to be tested. The weighting signals corresponding to the two mixers to be tested are made to be equal, and the weighting signals corresponding to the other two mixers that are not to be tested are set to "0". Therefore, for example, when the mixer 41 and the mixer 42 are to be tested, the weighting signal c0 and c90 for the mixer 41 and the mixer 42 are set to (1:1) equally, and the weighting signals c180 and c270 for the mixer 43 and mixer 44 are set to weighting "0".

Accordingly, according to the weighting signals c0, c90, c180, c270, two mixers corresponding to the two selectors output the testing input signals output from the two selectors. In other words, the weighting signals c0, c90, c180, c270 are set so that the two mixers output the testing input signals output from the two selectors. Accordingly, the four mixers 41-44 output signals in which weighting is added to output a-d of the corresponding testing selectors 31-34. As a result, the detection circuit outputs an error signal when the absolute value of the output signal e in which the signals in which weighting is added to the output a-d are compounded is larger than the threshold value.

Specifically, during testing, setting is made as the test signals test 1=test 4. Accordingly, the input buffer circuits 11-14 input the testing reference signals of phase 0°, 90°, 180°, 270° to the testing selectors 31-34, and do not output any signal to the selectors 21-24. The selectors 21-24 output the signals from the corresponding testing selectors 31-34 based on the test signals test 1=test 4.

Meanwhile, the selection signals sel 1-sel 4 are set to predetermined values. For example, setting is made as the selection signal sel 1=00, and the selection signal sel 2=11. Accordingly, the testing selector 31 outputs a signal of phase 0°, and the testing selector 32 output a signal of phase 180°. Accordingly, signals in reverse phases are used as testing input signals. At this time, since the weighting corresponding to the output of the testing selectors 33 and 34 are set as "0" as described below, the selection signals sel 3 and sel 4 may be any value.

Meanwhile, the weighting signals c0 and c90 are set so that the weighting for the output a and the output b of the selector 21 and the selector 22 is equal, and the weighting for the output c and the output d of the selector 23 and the selector 24 is set to "0".

According to the above, the mixers 41 and 42 corresponding to the selectors 21 and 22 are selected as the direct test target. Meanwhile, in practice, the direct test is to be performed for the selectors 21 and 22, the testing selectors 31 and 32 and the input buffers 11 and 12 corresponding to them as well. In addition, since the mixers 41-44 are formed in an integrated manner as two differential circuits, testing is to be performed indirectly for the mixers 42 and 44 as well.

Next, the selection signals sel 1 and sel 2 are switched. Accordingly, for example, the testing selector 31 is made to output the testing input signal of phase 90° based on the selection signal sel 1=01, and the testing selector 32 is made to output the testing input signal of phase 270° based on the selection signal sel 2=10. Testing is performed in this state, and after completion, the selection signals sel 1 and sel 2 are switched. Accordingly, for example, the testing selector 31 is made to output the testing input signal of phase 180° based on the selection signal sel 1=11, and the testing selector 32 is made to output the testing input signal of phase 0° based on the selection signal sel 2=00. In the state, the test was performed, the selection signals sel 1 and sel 2 are switched. Accordingly, for example when the testing selector 31 outputs the testing input signal of phase 270° based on the selection signal sel 1=10, the testing selector 32 outputs the testing input signal of phase 90° based on the selection signal sel 2=01.

The above test is repeated by selecting two selectors from the mixers 41-44 except for the combination of the mixer 41 and 42. Accordingly, testing may be performed for all the mixers 41-44. The selection of the mixers to be the target of the above test and the selection of the phases of the signals to be used for the test are controlled by the control circuit 20. Meanwhile, only a part of the above test may also be performed.

According to the disclosed phase interpolator, the dynamic operation including the delay of the operation signal and the tilt of the waveform and the like may be examined, and a test that almost matches the actual system operation of the phase interpolator may be performed.

What is claimed is:
1. A phase interpolator comprising:
a plurality of testing selectors provided corresponding to a plurality of selectors, to each of which a plurality of testing input signals of different phases are input and each of which outputting any of the plurality of testing input signals according to a first control signal;
a plurality of selectors to each of which a predetermined input signal of different phases and a testing input signal output from a corresponding testing selector are input and each of which outputting one of the input signal and the testing input signal output from the corresponding testing selector according to a second control signal;
a plurality of mixers provided corresponding to the plurality of selectors, to each of which output of a corresponding selector is input and outputting an output signal in which signals to which weighting is added to output of the corresponding selectors are compounded according to a third control signal;
an output circuit outputting the output signal output from the plurality of mixers; and
a detection circuit detecting fluctuation in an amplitude of the output signal output from the plurality of mixers.

2. The phase interpolator according to claim 1, wherein
two testing selectors selected from the plurality of testing selectors output testing input signals of reverse phases from each other according to the first control signal;
two selectors corresponding to the two testing selectors output the testing input signals output from the corresponding two testing selectors according to the second control signal;
two mixers corresponding to the two selectors output an output signal in which signals in which weighting is added to the testing input signals output from the corresponding two selectors are compounded according to the third control signal; and
the detection circuit outputs an error signal when the output signal output from the two mixers is larger than a threshold value set in advance.

3. The phase interpolator according to claim 1, wherein
the plurality of selectors output the predetermined input signal according to the second control signal;
the plurality of mixers output an output signal in which signals in which weighting is added to the input signals output from the corresponding plurality of selectors are compounded; and
the output circuit outputs the output signal output from the plurality of mixers.

4. The phase interpolator according to claim 1, wherein the phase interpolator further comprises:
a control circuit generating a first control signal to select any of the plurality of testing input signals during testing and generating a second control signal to select the predetermined input signal during a system operation and to select a testing input signal that the corresponding testing selector outputs during the testing; and
a signal generation circuit generating a third control signal to determine a phase of an output signal output from the output circuit during the system operation.

5. The phase interpolator according to claim 1, wherein the plurality of testing input signals have waveforms of different phases from each other.

6. The phase interpolator according to claim 1, wherein the phase interpolator further comprises a plurality of input circuits each providing the testing input signal to each of the plurality of testing selectors, and providing the predetermined input signal to a selector corresponding to a corresponding phase in the plurality of selectors.

7. A semiconductor apparatus comprising:

a plurality of testing selectors provided corresponding to a plurality of selectors, to each of which a plurality of testing input signals of different phases are input and each of which outputting any of the plurality of testing input signals according to a first control signal;

a plurality of selectors to each of which a predetermined input signal of different phases and a testing input signal output from a corresponding testing selector are input and each of which outputting one of the input signal and the testing input signal output from the corresponding testing selector according to a second control signal;

a plurality of mixers provided corresponding to the plurality of selectors, to each of which output of a corresponding selector is input and outputting an output signal in which signals to which weighting is added to output of the corresponding selectors are compounded according to a third control signal;

an output circuit outputting the output signal output from the plurality of mixers; and a processing circuit connected to the output circuit.

8. A testing method of a semiconductor apparatus having a plurality of mixers, the testing method comprising:

outputting testing input signals of reverse phases from each other according to a first control signal by two testing selectors which are selected from a plurality of testing selectors provided corresponding to a plurality of selectors and to which a plurality of testing input signal of different phases are input;

outputting testing input signals output from the two corresponding testing selectors according to a second control signals by two selectors corresponding to the two testing selectors in the plurality of selectors;

outputting an output signal in which weighting is added to the testing input signals output from the corresponding two selectors are compounded according to a third control signals by two mixers corresponding to the two selectors in the plurality of mixers provided corresponding to the plurality of selectors; and outputting an error signal when the output signal output from the two mixers is larger than a threshold value set in advance by a detection circuit.

* * * * *